United States Patent
Abe

(10) Patent No.: US 10,023,975 B2
(45) Date of Patent: Jul. 17, 2018

(54) METHOD FOR PRODUCING SIC SINGLE CRYSTAL

(71) Applicant: TOYOTA JIDOSHA KABUSHIKI KAISHA, Toyota-shi, Aichi-ken (JP)

(72) Inventor: Nobuhira Abe, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 68 days.

(21) Appl. No.: 15/000,871

(22) Filed: Jan. 19, 2016

(65) Prior Publication Data
US 2016/0208409 A1 Jul. 21, 2016

(30) Foreign Application Priority Data
Jan. 16, 2015 (JP) .................................. 2015-007222

(51) Int. Cl.
| | | |
|---|---|---|
| *C30B 15/10* | (2006.01) | |
| *C30B 29/36* | (2006.01) | |
| *C30B 9/06* | (2006.01) | |
| *C30B 15/14* | (2006.01) | |

(52) U.S. Cl.
CPC ................ *C30B 29/36* (2013.01); *C30B 9/06* (2013.01); *C30B 15/14* (2013.01)

(58) Field of Classification Search
CPC .......... C30B 15/02; C30B 15/10; C30B 29/36
See application file for complete search history.

(56) References Cited

U.S. PATENT DOCUMENTS

| | | | | |
|---|---|---|---|---|
| 4,613,486 A | * | 9/1986 | Tatsumi | .................. C30B 15/32 117/217 |
| 2005/0066888 A1 | * | 3/2005 | Griggs | .................... C30B 15/20 117/217 |
| 2005/0087126 A1 | * | 4/2005 | Pratt | ...................... C30B 15/30 117/217 |
| 2012/0103251 A1 | | 5/2012 | Sakamoto et al. | |
| 2014/0116324 A1 | | 5/2014 | Kusunoki et al. | |
| 2015/0075419 A1 | | 3/2015 | Kado et al. | |

FOREIGN PATENT DOCUMENTS

| | | |
|---|---|---|
| CN | 202530196 U | 11/2012 |
| CN | 103620094 A | 3/2014 |
| JP | 2005-145764 A | 6/2005 |
| JP | 2005-350324 A | 12/2005 |
| JP | 2009-029659 A | 2/2009 |
| JP | 2015-054813 A | 3/2015 |
| WO | 2011/010394 A1 | 1/2011 |

* cited by examiner

*Primary Examiner* — Robert M Kunemund
(74) *Attorney, Agent, or Firm* — Oliff PLC

(57) ABSTRACT

A method for producing a SiC single crystal by a solution method of bringing a seed crystal into contact with a Si solution of C and pulling up a SiC single crystal, the production method of a SiC single crystal including connecting the seed crystal to a seed crystal holder, disposing a cooling mechanism on the seed crystal holder, and promoting cooling of the seed crystal holder by the cooling mechanism in accordance with an increase in the pulling amount of the SiC single crystal.

2 Claims, 1 Drawing Sheet

METHOD FOR PRODUCING SIC SINGLE CRYSTAL

TECHNICAL FIELD

The present invention relates to a method for producing a SiC single crystal by a solution method.

BACKGROUND ART

In the solution method, raw material Si is melted in a graphite crucible to form a Si solution, C is dissolved out from the graphite crucible into the Si solution to form a Si—C solution which is then warmed and held, and a seed crystal is put into contact with the Si—C solution, thereby growing a SiC single crystal.

In the solution method, a temperature gradient in which the temperature decreases from the inside of the Si—C solution toward the solution surface and from the lower part to the upper part must be maintained in the vicinity of the interface (growth interface) between the Si—C solution and the SiC single crystal during the SiC single crystal growth.

Patent Documents 1 and 2 disclose a method where a Si single crystal grown by the Czochralski method is cooled using a cooling mechanism disposed around the Si single crystal.

RELATED ART

Patent Document

[Patent Document 1] Japanese Unexamined Patent Publication No. 2009-029659
[Patent Document 2] Japanese Unexamined Patent Publication No. 2005-145764

SUMMARY OF THE INVENTION

Problems to be Solved by the Invention

In the case of producing a Si single crystal by the method disclosed in Patent Documents 1 and 2, it may be sufficient if the Si single crystal pulled up is cooled to the extent of solidifying the interface (growth interface) between the Si solution and the SiC single crystal.

However, in the case of producing a SiC single crystal by the solution method, cooling to the extent of solidifying the growth interface is insufficient, and the single crystal must be cooled to the extent of allowing a temperature gradient from the lower part toward the upper part to be maintained in the vicinity of the growth interface.

That is, a production method of a SiC single crystal that ensures the growth rate of SiC single crystal is not reduced in the vicinity of the growth interface during the SiC single crystal growth by sufficiently cooling the growth interface has been sought.

An object of the present invention is to provide a method for producing a SiC single crystal, which can solve the above-described problem.

Means to Solve the Problems

The gist of the present invention is as follows.
<1>A method for producing a SiC single crystal by a solution method of bringing a seed crystal into contact with a Si solution of C and pulling up a SiC single crystal, the production method of a SiC single crystal including connecting the seed crystal to a seed crystal holder, and promoting cooling of the seed crystal holder in accordance with an increase in the pulling amount of the SiC single crystal.
<2>The method according to item <1>, wherein cooling of the seed crystal holder is promoted in accordance with an increase in the pulling length of the SiC single crystal.
<3>The method according to item <1>or <2>, wherein cooling of the seed crystal holder is controlled by the temperature of cooling water.

Effects of the Invention

According to the present invention, cooling of a seed crystal holder is promoted in accordance with an increase in the pulling amount of a SiC single crystal, and the temperature rise at the growth interface due to an increase in the heat capacity of the growing SiC single crystal is thereby suppressed, so that a production method of a SiC single crystal, causing no reduction of the growth rate of SiC single crystal, can be provided.

MODE FOR CARRYING OUT THE INVENTION

Figure 1:
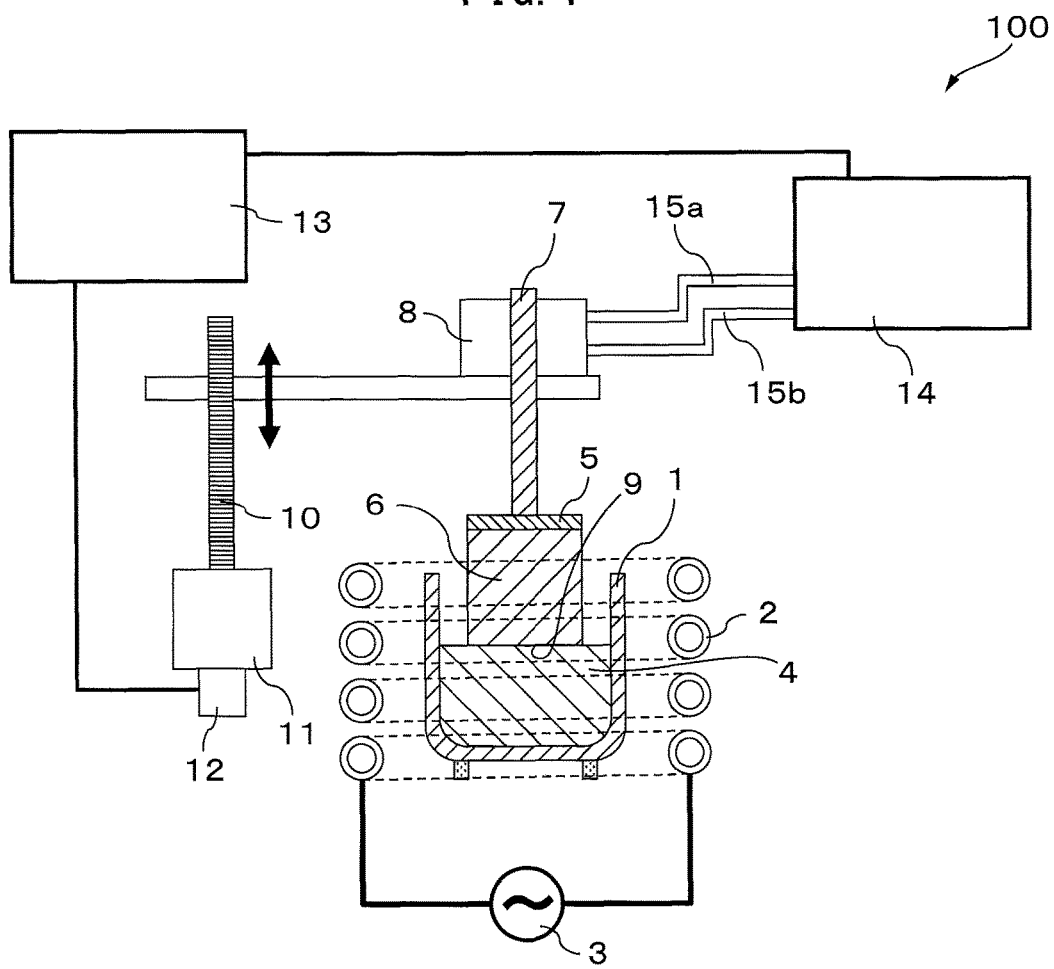
FIG. 1 A view illustrating an example of the outline of the SiC single crystal production apparatus used for carrying out the present invention.

The embodiment of the production method of a SiC single crystal according to the present invention is described below by referring to the drawings. The present invention is not limited to the following embodiment.

FIG. 1 is a view illustrating an example of the outline of the SiC single crystal production apparatus used for carrying out the present invention.

The SiC single crystal production apparatus 100 comprises a graphite crucible 1, an induction heating coil 2, and a high-frequency power source 3.

The induction heating coil 2 is disposed around the graphite crucible 1. The induction heating coil 2 and the high-frequency power source 3 are connected, and a high-frequency current is flowed to the induction heating coil 2, whereby raw material Si (not illustrated) is heated. By this heating, while melting the raw material Si, C is dissolved out from the graphite crucible 1 to form a Si—C solution 4. The Si—C solution as used herein means a Si solution of C.

A seed crystal holder 7 is connected to a seed crystal 5, and the seed crystal 5 is put into contact with the Si—C solution 4 and pulled up, thereby growing a SiC single crystal 6. At this time, a cooling mechanism 8 is disposed on the seed crystal holder 7, the seed crystal holder 7 is cooled by the cooling mechanism 8, and the SiC single crystal 6 and the vicinity of the growth interface 9 are cooled via the seed crystal 5 from the seed crystal holder 7.

The vicinity of the growth interface 9 is cooled from the seed crystal holder 7 to keep a lower temperature than that inside the Si—C solution 4. By cooling in this way, a temperature gradient from the lower part toward the upper part can be maintained in the vicinity of the growth interface 9 during the SiC single crystal growth, and a SiC single crystal 6 can be grown.

The vicinity of the growth interface 9 means a depth of up to 3 cm at the deepest from the growth interface 9. When a temperature gradient from the lower part toward the upper part is established to such a depth, a SiC single crystal 6 can be grown starting from the seed crystal 5.

The temperature gradient is preferably from 10 to 20° C./cm. When the temperature gradient is 10° C./cm or more, a SiC single crystal 6 can be grown, whereas when the temperature gradient is 20° C./cm or less, in relation to the later-described temperature of the Si—C solution 4, a temperature gradient can be formed in the vicinity of the growth interface 9 by the cooling from the seed crystal holder 7.

The temperature of the Si—C solution 4 is not particularly limited as long as the above-described temperature gradient can be maintained in the vicinity of the growth interface 9 during the SiC single crystal 6 growth, but the temperature is preferably from 1,900 to 2,200° C. When the temperature of the Si—C solution 4 is 1,900° C. or more, not only the raw material Si is melted but also C can be dissolved out from the graphite crucible 1 to form a Si—C solution 4. On the other hand, when the temperature is 2,200° C. or less, the above-described temperature gradient can be maintained in the vicinity of the growth interface 9 during the SiC single crystal 6 growth. The temperature of the Si—C solution 4 is defined as a temperature in the portion where the temperature of the Si—C solution 4 contained in the graphite crucible 1 is highest.

The temperature of the growth interface 9 is not particularly limited as long as it is a temperature not outside the range of the temperature gradient and the range of the temperature of the Si—C solution 4, but the temperature is preferably from 1,850 to 2,000° C. When the temperature is 1,850° C. or more, a SiC single crystal 6 can be grown, whereas when the temperature is 2,000° C. or less, the above-described temperature gradient can be maintained during the SiC single crystal 6 growth by the cooling from the seed crystal holder 7.

As described in the foregoing pages, the temperature in the vicinity of the growth interface 9 must be precisely controlled, but the vicinity of the growth interface 9 is also a region where thermal conditions are significantly changed along with the growth of a SiC single crystal 6.

Therefore, in the present invention, in accordance with an increase in the pulling amount of the SiC single crystal 6, cooling of the seed crystal holder 7 is promoted by the cooling mechanism 8, and cooling of the SiC single crystal 6 and the vicinity of the growth interface 9 is promoted via the seed crystal 5.

For this purpose, the seed crystal 5 is connected to the seed crystal holder 7, and the seed crystal holder 7 and the cooling mechanism 8 are connected to a motor 11 via a ball screw 10. The ball screw 10 converts the rotational movement of the motor 11 into the vertical movement. Rotation of the motor 11 brings about, via the seed crystal holder 7, pulling up of the seed crystal 5 from the growth interface 9 and growth of a SiC single crystal 6. At this time, following elevation of the seed crystal holder 7, the cooling mechanism 8 is also moved up.

The cooling mechanism 8 is not particularly limited as long as it is a mechanism capable of cooling the seed crystal holder 7, such as air blown from a radiation cooling fan, but a structure having a cooling water channel is preferred. As described above, the temperature of the Si—C solution 4 is preferably from 1,900 to 2,200° C. and the temperature of the seed crystal holder 7 connected via the seed crystal 5 to the Si—C solution 4 becomes very high. The seed crystal holder 7 is cooled by the cooling mechanism 8.

Figure 2:
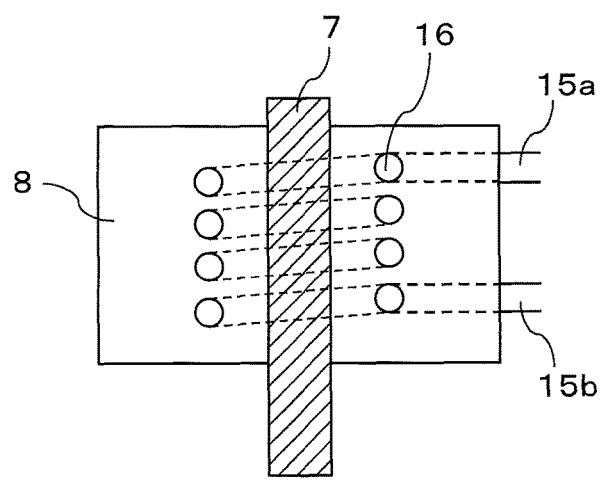
FIG. 2 A view illustrating an example of the outline of the cooling mechanism.

FIG. 2 is a view illustrating an example of the outline of the cooling mechanism 8.

The cooling mechanism 8 has a cooling water channel 16 arranged in a spiral manner around the seed crystal holder 7. One side of the cooling water channel 16 serves as a cooling water inlet 15*a*, and other side serves as a cooling water outlet 15*b*. Cooling water is introduced from the cooling water inlet 15*a*, the cooling water is flowed into the cooling water channel 16, thereby cooling the seed crystal holder 7, and the cooling water is discharged from the cooling water outlet 15*b*.

The seed crystal holder 7 is carbon-made and therefore, has high thermal conduction. In addition, the seed crystal holder 7 is smaller in the diameter than the SiC single crystal 6 grown and therefore, receives a large quantity of heat from the SiC single crystal 6 having a large heat capacity. Therefore, in the present invention, the flow rate of cooling water is increased to promote cooling of the seed crystal holder 7 in accordance with an increase in the pulling amount of the SiC single crystal 6.

The method for promoting cooling of the seed crystal holder 7 in accordance with an increase in the pulling amount of the SiC single crystal 6 includes a method of promoting cooling of the seed crystal holder 7 in accordance with a volume increment, a weight increment, etc. resulting from pulling up of the SiC single crystal 6. The detection method for the pulling amount is not particularly limited as long as it is a method of cooling the seed crystal holder 7 by taking into account the fact that the quantity of heat received by the seed crystal holder 7 is increased as the SiC single crystal 6 grows. As the method for detecting the pulling amount, for example, a load cell is connected to the seed crystal holder 7, and the weight increment of the SiC single crystal 6 is detected using the buoyancy.

In the embodiment illustrated in FIG. 1, cooling of the seed crystal holder 7 is promoted in accordance with an increase in the pulling length of the SiC single crystal 6.

An encoder 12 is attached to the motor 11, and a control mechanism 13 is attached to the encoder 12. In addition, the encoder 12 is connected with the control mechanism 13, and the control mechanism 13 is connected with a cooling water feeding mechanism 14.

A signal regarding the rotation speed of the motor 11 detected by the encoder 12 is sent to the control mechanism 13, and the control mechanism 13 converts the signal into the pulling length of the SiC single crystal 6. Based on the increase in the pulling length, the control mechanism 13 sends a signal such that cooling water necessary to promote cooling of the seed crystal holder 7 by the cooling mechanism 8 is fed from the cooling water feeding mechanism 13.

The cooling water feeding mechanism 14 may only feed cooling water necessary for cooling to the cooling mechanism 8 or, as in the embodiment illustrated in FIG. 1, may also recover cooling water from the cooling mechanism 8 and circulate the cooling water.

In the embodiment illustrated in FIG. 1, the cooling water feeding mechanism 14 feeds cooling water to the cooling mechanism 8 via the cooling water inlet 15*a* and on the other hand, returns the cooling water from the cooling mechanism 8 via the cooling water outlet 15*b*.

A cooler (chiller) function may be imparted to the cooling water feeding mechanism 13 to control the temperature of cooling water fed to the cooling mechanism 8, based on the signal regarding the pulling length, which is sent from the control mechanism 13.

Therefore, by taking into account the fact that the quantity of heat received by the seed crystal holder 7 is increased with an increase in the pulling length of the SiC single crystal 6, cooling of the seed crystal holder 7 is promoted, whereby a constant temperature gradient is always established in the vicinity of the growth interface 9.

As a result, waiting time until the temperature gradient in the vicinity of the growth interface 9 reaches a desired range can be suppressed, and a SiC single crystal 6 can be produced without reducing the growth rate of the SiC single crystal 6.

In addition, due to pulling up at a constant rate, a secondary effect that the outer circumference of the produced SiC single crystal 6 becomes clear can also be expected.

Industrial Applicability

According to the present invention, the production method of a SiC single crystal, ensuring that the growth rate of a SiC single crystal is not reduced, can be provided. Hence, there is great industrial applicability in the present invention.

Description of Numerical References

1 Graphite crucible
2 Induction heating coil
3 High-frequency power source
4 Si—C Solution
5 Seed crystal
6 SiC Single crystal
7 Seed crystal holder
8 Cooling mechanism
9 Growth interface
10 Ball screw
11 Motor
12 Encoder
13 Control mechanism
14 Cooling water feeding mechanism
15*a* Cooling water inlet
15*b* Cooling water outlet
16 Cooling water channel
100 SiC Single crystal production apparatus

The invention claimed is:

1. A method for producing a SiC single crystal by a solution method of bringing a seed crystal into contact with a Si solution of C obtained by disposing an induction heating coil around a graphite crucible and flowing a high-frequency current to the induction heating coil to melt a raw material Si in the graphite crucible while dissolving C out from the graphite crucible to a molten Si, and pulling up the SiC single crystal, the production method comprising:
    connecting the seed crystal to a seed crystal holder,
    detecting pulling volume, weight or length of the SiC single crystal, and
    promoting cooling of the seed crystal holder in accordance with an increase in the pulling volume, weight or length of the SiC single crystal to grow the SiC single crystal by maintaining a temperature gradient from a lower part toward an upper part in a growth interface.

2. The method according to claim 1, wherein cooling of the seed crystal holder is controlled by the temperature of cooling water.

* * * * *